United States Patent [19]

Middelman

[11] Patent Number: 5,269,863
[45] Date of Patent: Dec. 14, 1993

[54] CONTINUOUS PROCESS FOR THE MANUFACTURE OF SUBSTRATES FOR PRINTED WIRE BOARDS

[75] Inventor: Erik Middelman, Arnhem, Netherlands

[73] Assignee: Akzo nv, Arnhem, Netherlands

[21] Appl. No.: 989,736

[22] Filed: Dec. 10, 1992

Related U.S. Application Data

[63] Continuation of Ser. No. 763,790, Sep. 23, 1991, abandoned.

[30] Foreign Application Priority Data

Sep. 24, 1990 [NL] Netherlands ............... 9002080

[51] Int. Cl.$^5$ .................... H05K 3/02; H05K 3/46; B32B 31/20
[52] U.S. Cl. .................... 156/177; 156/176; 156/178; 156/324; 156/439; 156/441; 66/84 A; 66/84 R
[58] Field of Search ............ 428/105, 110, 901; 66/84 A, 84 R; 28/102, 101; 156/176, 177, 178, 324, 439, 441

[56] References Cited

U.S. PATENT DOCUMENTS

| | | | |
|---|---|---|---|
| 3,649,411 | 4/1965 | Bolles | 156/177 X |
| 3,756,893 | 9/1973 | Smith | 156/440 |
| 4,460,633 | 7/1984 | Kobayashi et al. | 428/110 |
| 4,547,421 | 10/1985 | Dunbar . | |
| 4,556,440 | 12/1985 | Krueger . | |
| 4,587,161 | 5/1986 | Barrell et al. . | |
| 4,591,659 | 5/1986 | Leibowitz | 428/901 X |
| 4,609,586 | 9/1986 | Jensen et al. | 428/901 X |
| 4,659,425 | 4/1987 | Eggers et al. | 156/324 X |
| 4,670,080 | 6/1987 | Schwarz et al. | 156/324 X |
| 4,814,945 | 3/1989 | Leibowitz | 428/901 X |
| 4,877,470 | 10/1989 | Krueger . | |
| 4,992,123 | 2/1991 | Cave et al. | 156/177 X |

FOREIGN PATENT DOCUMENTS

| | | |
|---|---|---|
| 0153060 | 8/1985 | European Pat. Off. . |
| 0231737 | 8/1987 | European Pat. Off. . |
| 0215392 | 4/1990 | European Pat. Off. . |
| 0374319 | 6/1990 | European Pat. Off. . |
| 56-56825 | 5/1981 | Japan ............ 156/178 |
| WO83/02085 | 6/1983 | PCT Int'l Appl. . |
| WO88/01938 | 3/1988 | PCT Int'l Appl. . |
| WO89/00216 | 1/1989 | PCT Int'l Appl. . |
| WO89/03445 | 4/1989 | PCT Int'l Appl. . |
| 1043893 | 9/1966 | United Kingdom . |
| 1364076 | 8/1974 | United Kingdom . |

OTHER PUBLICATIONS

IBM Technical Disclosure Bulletin entitled "Low Dielectric Constant Material for Printed Circuit Boards," vol. 22, No. 5, Oct. 1979.

*Primary Examiner*—Jeff H. Aftergut
*Attorney, Agent, or Firm*—Louis A. Morris

[57] ABSTRACT

A method for the manufacture in a continuous process of a flat substrate from a fibres-reinforced matrix for a printed circuit, in which use is made of at least two moving layers of reinforcing fibres and the fibres are positioned in at least two crossing directions, whereupon the filaments layers provided with matrix material, optionally together with one or more electrical conducting layers, such as a metal foil, and/or insulating layers on one or on either outer side, are passed through a preferably heated laminating zone, such as a double belt press, characterized in that use is made of filaments-containing layers made up of a plurality of mutually parallel filaments that are not bonded in the form of a fabric and extend substantially linearly.

25 Claims, 4 Drawing Sheets

CONTINUOUS PROCESS FOR THE MANUFACTURE OF SUBSTRATES FOR PRINTED WIRE BOARDS

This is a continuation of application Ser. No. 07/763,790 filed Sept. 23, 1991 now abandoned.

BACKGROUND OF THE INVENTION

The invention relates to a method for the manufacture, in a continuous process, of a flat substrate for a printed wire board (PWB) from a fibre-reinforced matrix, in which process at least two moving layers of threads of reinforcing fibres are employed and fibres are disposed in at least two crossing directions, after which the layers of threads provided with matrix material are passed through a preferably heated laminating zone, such as a double belt press, and the laminate is provided on one or on either side with means for depositing electrically conductive traces, e.g., for deposition on the laminate of a copper foil that can be partially removed again by etching. The invention further comprises a printed wire board having favourable properties.

Such a process is known, int. al., from EP 0 231 737 A2. For the layers of threads of reinforcing fibres use is made in said known process of fabrics or non-wovens in which the fibres are interlinked in the conventional manner and have a large number of curves and twists.

Although passable results can be obtained with the known method, there are certain drawbacks to the use of reinforcing fibres in the form of woven fabrics or non-wovens, which drawbacks are augmented in the case of printed wire boards of higher interconnection density and/or smaller thickness. Particularly when printed wire boards are employed which are deposited on a thin substrate composed of, say, glass cloth impregnated with epoxy resin, the following drawbacks may become manifest: high production costs to manufacture the thin fabric, a relatively large number of process steps, a low production rate, an existing production process that is hard to automate, and a comparatively mediocre surface quality of the substrate, as well as at times varying properties in two mutually perpendicular (X- and Y-) directions parallel with the plane of the substrate. Another drawback to a conventional substrate of thin woven fabrics is the relatively limited content of fibre material with a comparatively low linear thermal coefficient of expansion (TCE). The corresponding high content of matrix material, such as epoxy resin, of comparatively high TCE generates linear thermal coefficients of expansion (TCE-X, Y, Z) of the conventional substrate that are high as compared with the TCE of the components to be mounted on it. The modulus of elasticity and the strength are not as high as is feasible either, nor is the dimensional stability sufficient for certain applications. Conventional printed wire boards containing non-wovens as reinforcing material will generally exhibit the same drawbacks as when woven fabrics are employed. The non-wovens are of the type described in U.S. Pat. No. 4,547,421, the fibres or filaments lying substantially in one plane in random twists and curves and being thermally, chemically, and/or mechanically interlinked. The term non-woven, whenever it is used in the description and the claims, refers to a product of the aforementioned type.

EP 0 215 392 B1 also describes a continuous process for the manufacture of substrates for printed wire boards, in which the reinforcing fibres used are likewise in the form of glass fabrics impregnated with epoxy resin.

EP 0 326 577 (WO-88/01938) describes a discontinuous system for the manufacture of a substrate for printed wire boards, in which layers of reinforcing threads which cross at 90° are manufactured with the use of a flat square form, about which reinforcing threads are wound as it is rotated about two axes of symmetry in succession.

In U.S. Pat. No. 4,587,161 a manufacturing process for printed wire boards is described in which the substrate is made up of a mixture of polyester resin and epoxy resin reinforced with a glass fibre mat or with short fibres distributed into the resin.

EP 0 374 319 A1 describes a discontinuous process for the manufacture of multilayer printed wire boards comprising the steps of: forming a plurality of layers of a composite material by lay-up of a fibre tape, the fibre tape being a single layer of fibres coated with a resin and heated to a semi-cured stage.

In WO 89/00216 a process is described for forming a nonwoven layer of two groups of perpendicularly crossing yarns. With the weft yarns under tension, said layer is introduced into a layer of settable material.

WO 83/02085 describes a process in which a laminate composed of a number of layers of perpendicularly crossing threads which do not form a woven fabric is impregnated with a thermoplastic synthetic material. From the resulting fibre-reinforced sheet there may be formed, after heating, various fibre-reinforced end products that may be closed or not.

In EP 0 153 060 A3 a process is described for the manufacture of a flexible reinforced sheet material which may be employed in the same end uses as tarpaulin or as a fabric for inflatable structures or as a robust wrapping material. The manufacturing process comprises the forming of several layers of crossing, non woven layers of threads. These are introduced into a layer of bonding material formed on a moving conveyor belt.

GB 1 364 076 describes a structural laminated fibre-reinforced plastics sheet material composed of a number of UD prepregs of, say, glass fibres or carbon fibres in a thermosetting resin disposed on either side of a datum plane. In superposed prepregs the fibres are at different angles to each other. The prepregs package may be coated on the outer sides with a sheet of titanium.

IBM Technical Disclosure Bulletin Vol. 22, No. 5, October 1979, page 1799 describes a laminate for printed wire boards with a low dielectric constant because the matrix of epoxy resin contains a filler in the form of hollow glass microspheres having a diameter of 20–200 $\mu$m and a wall thickness of 0.5–2 $\mu$m.

GB 1 043 893 describes a continuous process for the manufacture of a non-woven. First, a central double layer of "weft threads" is deposited and subsequently covered on either side with a layer of "warp threads". The non-woven is next passed through an adhesive bath. The products can be used for producing table napkins, towels, tablecloths, etc., which articles can be thrown away after use.

In actual practice there is a tendency toward constructing more compact electronic equipment. This means that, increasingly, also printed wire boards will have to be manufactured which have a higher interconnection density and satisfy more stringent quality requirements. Also because of this trend it is possible that the use of conventional substrates or boards containing reinforcing fibres in the form of woven fabrics or nonwovens or short fibres will increasingly meet with objections on account of the drawbacks listed above.

The invention has for its object to provide a process of the type mentioned in the opening paragraph in which said drawbacks have been overcome.

SUMMARY OF THE INVENTION

A continuous process for the manufacture of a flat substrate for a printed wire board from a fiber-reinforced matrix, the continuous process comprising a laying stage in which at least two layers of threads of reinforcing fibers are superposed, the layers of threads being provided with matrix material, and a lamination stage in which the layers of threads are passed through a laminating zone to form a laminate of the layers of threads provided with matrix material, the laminate being provided on one side or on both sides with means for generating electrically conductive tracks, said layers of threads being composed of a plurality of mutually parallel threads of reinforcing fibers which are not bonded in the form of a woven fabric and which extend substantially rectilinearly, and the layers are superposed such that reinforcing fibers are disposed in at least two crossing directions.

DETAILED DESCRIPTION OF THE INVENTION

The process is characterized according to the invention in that use is made of threads-containing layers composed of a plurality of mutually parallel threads which are not bonded in the form of a woven fabric and extend substantially rectilinearly, with threads from the aforementioned superposed layers of threads not bonded in the form of a woven fabric preferably crossing at an angle of 90°, 60° or 45°. It should be noted that in the description and the claims one layer of threads always refers to either a single or a double layer of which the threads have the same direction.

According to the invention, in one embodiment, the layers of threads are advantageously composed of a plurality of separate wholly unbonded reinforcing yarns, on which the matrix material is provided after the layers have been formed and prior to lamination. Alternatively, according to the invention use can advantageously be made of layers of threads in the form of a self-sustaining fiber-reinforced matrix material, more particularly a prepreg, in which the fibers are made up of a plurality of threads which are not bonded in the form of a woven fabric and extend mutually parallel and substantially rectilinearly. In the continuous process according to the invention, the laying stage preferably comprises depositing each of said layers of threads not bonded in the form of a woven fabric in a plane moving continuously in the production direction (called 0° direction). According to the invention, in one embodiment, each of said layers of threads not bonded in the form of a woven fabric is laid on a transport means moving continuously in the production direction (0° direction), more particularly with use being made of a laying unit. It is advantageous, hence preferred, to provide at least 3, more preferably 5-7, of said layers of threads not bonded in the form of a woven fabric, the overall amount of reinforcing fibres to be provided, in one or more layers, in a particular angular direction, say the production direction (0° direction), preferably being virtually equal to the overall amount of reinforcing fibres to be provided, in one or more layers, in some other angular direction, say about at right angles (90° direction) to the production direction. According to a preferred embodiment of the invention, a favorable substrate construction is obtained when said layers of threads are arranged in mirror image relationship relative to the plane of symmetry. Said plane of symmetry is a plane parallel to the plane of the laminate and passing through the center of the laminate. In a practical embodiment of the process according to the invention, a substrate is composed of 3, 5, 7 or some higher uneven number of said layers of threads not bonded in the form of a woven fabric, with the threads being provided in superposed layers from one side of the substrate to the other successively in alternating angular directions of 0° and 90° or conversely vis-à-vis the production direction (0° direction). According to the invention, it is preferred that the threads in each of said layers of threads not bonded in the form of a woven fabric are kept under tension at least just prior to being rigidly confined in the matrix, more particularly with the use of needle belts positioned on either side of the transport elements and moving with them. As a result the orientation of the threads in the layers remains fixed during the entire process and there will be no such objectionable phenomenon as, say, bow and twist. It is of advantage that each thread according to the invention be composed of a, preferably virtually untwisted, bundle of continuous filaments. According to a further preferred embodiment of the process according to the invention, all threads are fed to the corresponding laying units from thread or yarn packages in a creel. The yarns can either be unwound from the packages by rolling or be pulled off of the packages overhead. According to the invention, said matrix material can contain a synthetic material that may be either a thermosetting synthetic material, such as epoxy resin, or a thermoplastic or elastomeric synthetic material, and the reinforcing fibres can be selected from, among others, the following group of materials: glass, carbon, aromatic polyamide, quartz, silica, ceramics or liquid crystal polymers. Alternatively, fibres of other materials can be employed, e.g. fibres of nylon, polyethylene terephthalate or rayon. Also, use can be made of bicomponent fibres or of hollow fibres. Also, according to the invention the matrix may be composed of a combination of two or more of said synthetic materials.

Since in the process according to the invention the layers of threads are, for the most part, built up directly from extended threads or yarns not bonded in the form of a woven fabric, without an intermediate product in the form of a woven fabric or a non-woven being produced first, a particularly economical process is obtained, by means of which it is possible to make a substrate or board having a high fibres content, viz. from 30 to 65% by volume of fibres combined with 70 to 35% by volume of matrix material. The described construction according to the invention from layers of threads having a plurality of mutually parallel threads which are not bonded in the form of a woven fabric and extend rectilinearly under tension will have a favourable effect on the final properties of the substrate. Thus, a printed wire board with a substrate manufactured according to the invention may have one or more of the following properties: a lower TCE in the X- and Y-directions of the order of 5 to $16 \times 10^{-6}/°$ C.; the same TCE in the X-and Y-directions (x Y, the two being parallel at the lower and upper surf aces of the substrate); a very low TCE in the Z-direction X and Y), i.e., less than or equal to 0 to $60 \times 10^{-6}/°$ C.; higher dimensional stability; improved surface area quality; lower water absorption; lower solvent absorption; improved ease of handling. Said favourable properties can also be realized when manufacturing very thin substrates.

There is yet a further important advantage to the use according to the invention of the special arrangement of the reinforcing threads having a reinforcing fibres content of about 60% by volume, i.e. a very low TCE (in the X-, Y-, and Z-directions) in the temperature range above the matrix's glass transition temperature $T_g$. By selecting the appropriate matrix-fibres combination it is possible to manufacture a substrate having equal TCE values in the X- and Y-directions above and below the matrix's glass transition temperature. Consequently, there can be obtained according to the invention a substrate or board having a very low thermal expansion over the entire soldering temperature range employed in actual practice. According to the invention, substrates or boards having said favourable properties can be manufactured by making use of conventional epoxy resins with a relatively low $T_g$ of, say, 130° C.

To avoid break-downs in the production process the method according to the invention is advantageously characterized in that a buffer system is employed, use being made of a sub-frame containing all the laying units for the different layers of threads, which sub-frame during normal operation moves temporarily against the production direction, say at a rate of 10% of the rate of output, building up a certain buffer length of layers of threads, and in the case of a break-down, e.g. a thread breakage, the laying units are stopped and the transport elements continue to move, optionally with their production rate temporarily reduced, say to 10% of the normal rate of output, after which, once the failure has been repaired, a certain buffer length of layers of threads is again built up. In this way shutting down of the production process is avoided, hence there will be no objectionable premature curing of the synthetic matrix in places where the temperature is fairly high, such as just upstream of the entrance rollers of the double belt press. For, if the synthetic material or resin there were to be cured prematurely, the double belt press's belts might be damaged. Said problems are avoided by making use of the buffer system according to the invention.

The invention also comprises a particularly effective method for the manufacture of a multilayer printed wire board in a continuous process, which comprises a board provided on both sides with traces of, preferably, copper being provided on either side with a moving layer of reinforcing fibres, whereupon the board containing the layers of threads provided with matrix material is passed, optionally together with a metal foil on one or on either outer side, through a preferably heated laminating zone, for instance a double belt press, the process being characterized in that use is made of threads-containing layers composed of a plurality of mutually parallel threads which are not bonded in the form of a woven fabric and extend substantially rectilinearly. According to the invention, the construction advantageously is such that a first laminate of layers of threads is provided in a plane moving continuously in the production direction (0° direction), such as a transport element, more particularly with the use of a laying unit, next there is deposited on the first laminate of layers of threads a board provided on both sides with electrically conductive traces, and subsequently there is provided on the reverse side of the board a second laminate of layers of threads, after which the board provided on either side with a matrix material-containing laminate of layers of threads is passed through the heated laminating zone.

In a preferred embodiment of the invention each laminate of layers of threads is composed of at least three layers of threads and the threads from superposed layers cross at an angle of, preferably, 90°, 60° or 45°, with the threads in each of said layers of threads not bonded in the form of a woven fabric being kept under tension at least just prior to being rigidly enclosed in the matrix, more particularly by means of needle belts provided on either side of the transport elements and moving along with them.

According to the invention, in the manufacture of substrates for both single and multilayer PWBs there may, if desired, be provided in addition to the two or more layers of threads made up of extended threads not bonded in the form of a woven fabric mentioned hereinbefore, in mirror image relationship relative to the plane of symmetry, one or more layers composed of a non-woven or a woven fabric. In such a case according to the invention the layers composed of a non-woven or a woven fabric are alternated with said layers of extended threads not bonded in the form of a woven fabric, preferably such that the layers of threads not bonded in the form of a woven fabric always form the outer layers of threads. Such an arrangement makes it possible to adjust the dielectric constant in the desired degree while maintaining the substrate's favourable surface area quality, and also enables the reducing of interlaminar tensions.

According to the invention, prior to being applied to the threads the liquid matrix material may optionally be subjected to a treatment for the removal, more particularly under vacuum, of volatile or gaseous constituents, such a treatment being beneficial to the quality of the substrate.

The invention further comprises a process characterized in that prior to the application of the matrix material the laminate of layers of threads is bonded by means of a textile bond, e.g. by stitching.

According to the invention, upstream or downstream of the laminating zone an upper layer, which generally will be thinner than the substrate, can be applied with advantage to the substrate not coated with a metal foil. According to a preferred embodiment of the process according to the invention, the upper layer used will contain a catalyst, e.g. palladium, promoting the precipitation of electrically conductive metal, such as copper. Other than only in the upper layer such a catalyst may be present also in the substrate in its entirety. According to the invention, the upper layer comprises at least one layer of a crosslinked polyamine polymer, more particularly polyethylene imine. Such is specified in greater detail in Netherlands Patent Application 8 902 886. If the upper layer is provided downstream of the laminating zone, it may for instance be by means of dipping, roller coating or the like.

In addition the invention comprises a printed wire board composed of a fiber-reinforced substrate manufactured according to the invention and provided with tracks of electrically conductive material, which PWB is characterized in that the substrate substantially made up of reinforcing fibres impregnated with matrix material contains 30 to 65% by volume of fibres and 70 to 35% by volume of matrix material. The invention also comprises a printed wire board where the matrix of the substrate is by and large made up of foam. Another favorable embodiment of the printed wire board is characterized according to the invention in that the matrix of the substrate contains a large number of hollow particles, more particularly hollow spheres of glass. Since the gas in the foam and in the spheres has a very low dielectric constant, the dielectric constant of the substrate can be reduced in this manner.

Further, the invention comprises a printed wire board composed of a substrate of a fibre-reinforced matrix material, such as a polymeric synthetic material, which substrate is provided on at least one side with electrically conductive traces or the like, with the components required for the printed wire board, such as resistors, condensors or the like, being provided on these traces, the printed wire board being characterized in that the reinforcing fibres are present in the form of at least a number of layers of extended threads not bonded in the form of a woven fabric, with the threads in superposed layers crossing and the linear thermal coefficient of expansion of the substrate parallel with the plane of the printed wire board being 0 to $16 \times 10^{-6}/°$ C., preferably 5 to $12 \times 10^{-6}/°$ C. Such a printed wire board is advantageously characterized according to the invention in that said thermal coefficient of expansion of the substrate differs not more than 20% from the thermal coefficient of expansion of said components; preferably, however, the substrate's TCE is virtually equal to that of said components.

The printed wire board according to the invention is also characterized in that in the substrate at the location of the layers of extended threads not bonded in the form of a woven fabric said threads constitute at least 30% by volume, preferably 50 to 65% by volume.

The printed wire board according to the invention is still further characterized in that the surface area of the substrate on the printed wire board side is smooth. In the printed wire board according to the invention the reinforcing fibres in said substrate preferably are formed at least on its outer side by said layers of extended threads not bonded in the form of a woven fabric.

The invention will be further illustrated with reference to the schematic drawing.

Figure 1:
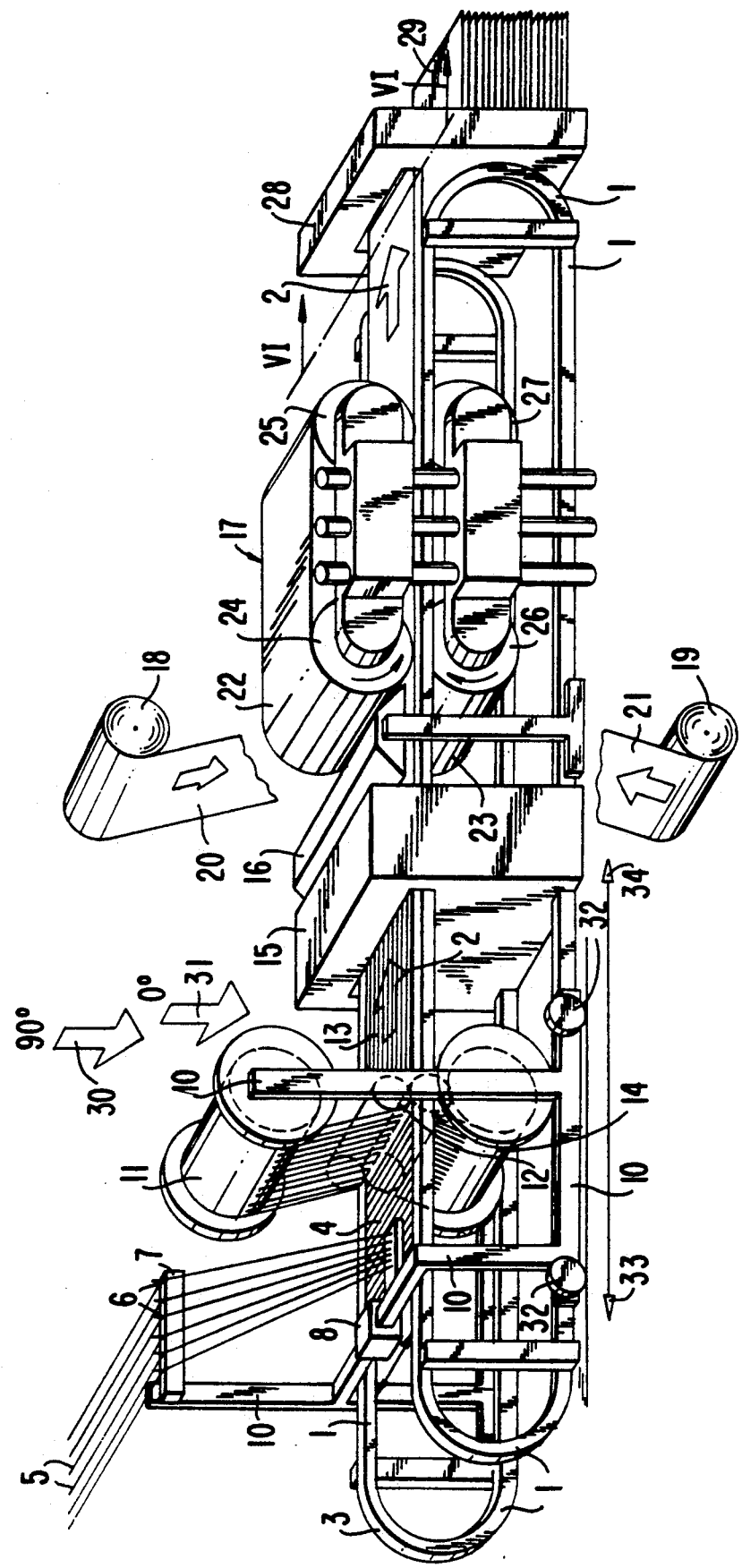
FIG. 1 is a perspective view of an apparatus for the manufacture of substrates for printed wire boards according to the invention.
Figure 3:
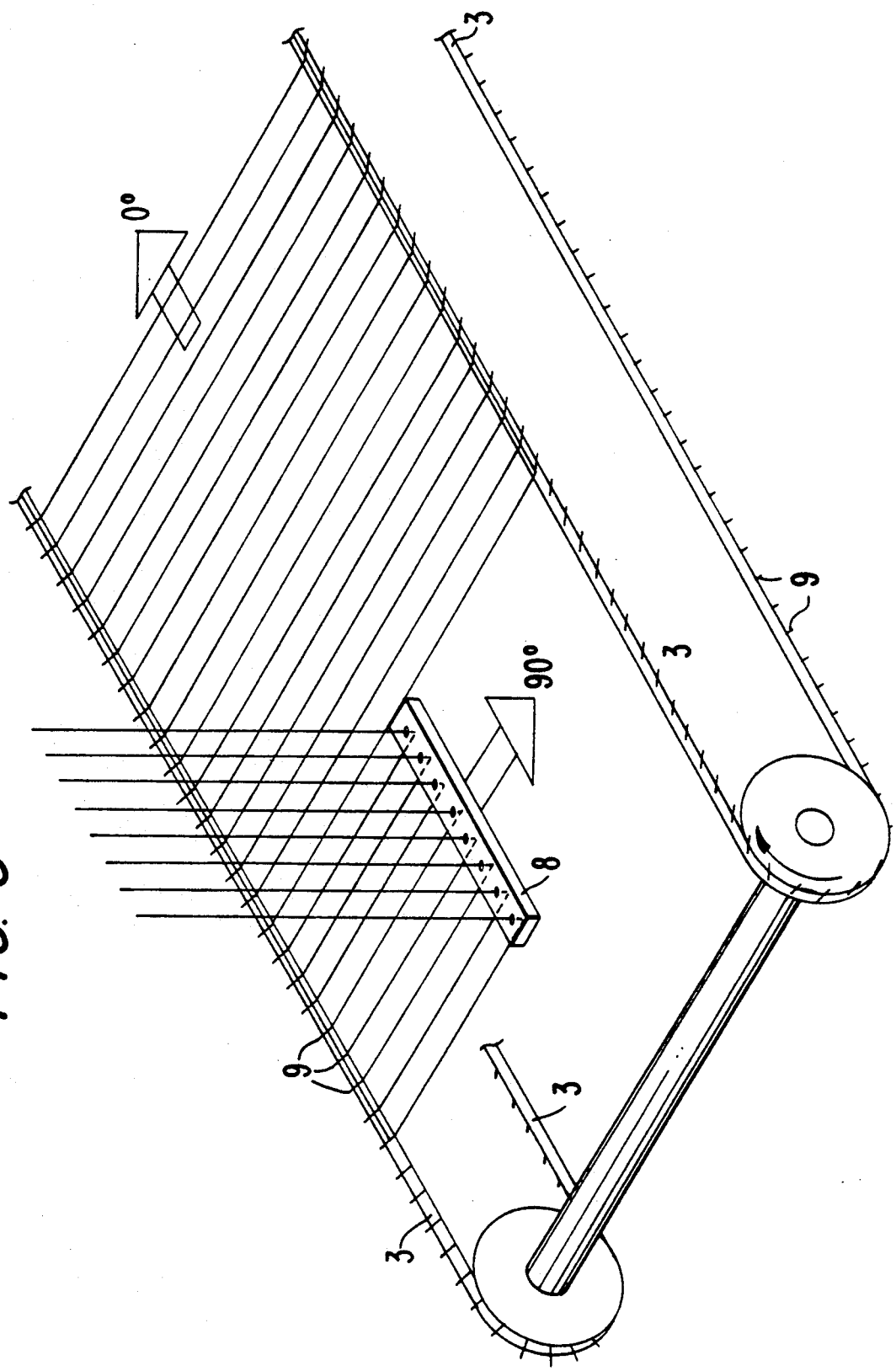
FIG. 3 is a perspective view of a detail of the system for laying threads on needle belts.

FIG. 1 is a view of two frame beams 1 extending on either side of the apparatus over virtually the entire length of the machine, to which there have been attached endless transport elements in the form of needle belts 3, which go around in the direction of the arrows 2 (cf. also FIG. 3). The direction of the arrows 2 also is indicative of the production direction, which is alternatively referred to as the 0° direction. In the construction shown in FIG. 1 there is first provided on the needle belts 3 in the 90° direction, i.e. at right angles to the production direction, a double layer of threads 4. The threads 5 of the 90° layer 4 each consist of a, preferably untwisted, reinforcing yarn, say a roving of 300 Tex made up of filaments of E-glass. Each of the threads or yarns is pulled off of its own yarn package (not shown), which together with a large number of other yarn packages is arranged in a magazine creel (not shown) known in itself, which also contains conventional yarn tensioners, so that the threads can be provided on the needle belts 3 at the proper tension. Via the cross beam 7 provided with yarn guides 6 the yarns 5 pulled of f of the packages in the creel are laid, under tension, around the needles 9 of the needle belts 3 with the aid of the 90° laying unit 8 reciprocating in the direction of the arrow. In this manner a layer of threads is formed which extends in the 90° direction and is composed of a plurality of mutually parallel unbonded threads extending rectilinearly.

A next layer of threads 13 extending in the 0° direction is then laid, also under tension, on top of the 90° layer 4 via a top threads or yarn beam 11 rotatably mounted on the subframe 10 and an idler 12. In a similar manner a second layer of threads also extending in the 0° direction is applied under tension to the bottom of the 90° layer 4 via a bottom threads or yarn beam 14 rotatably mounted on the subframe 10. Downstream of the beams 11 and 14 three layers of threads will then have formed, each containing a plurality of threads not bonded in the form of a woven fabric and extending mutually parallel and stretched under tension. From the bottom towards the top the threads in the three superposed layers extend in the 0° direction, the 90° direction, and the 0° direction, so that the threads from superposed layers cross at an angle of 90° to form a laminate. Then, optionally after having been dried to remove volatile constituents, the thus formed laminate is fed by the transport elements in the form of the needle belts 3 to the metering unit 15, where (in a manner not shown) the desired amount of a liquid thermosetting synthetic material, say epoxy resin, is added to the laminate together with a curing agent, and the laminate is impregnated. Optionally, the matrix material can be subjected to a vacuum treatment prior to being applied to the threads. Downstream of the metering unit 15 is an infrared preheater 16, which is positioned just upstream of the double belt press indicated in its entirety with 17 and known in itself. At the top and the bottom of the entrance to the double belt press are situated the rollers 18 and 19, from which the copper foils 20 and 21, respectively, are unwound. The double belt press by and large consists of upper and lower conveyor belts 22, 23 of, say, stainless steel, which pass over corresponding cylinders 24, 25, 26, 27 provided with an appropriate drive.

The construction in a known manner of the double belt press is such that the laminate composed of three copper foil-coated layers of threads passing between the belts 22, 23 can be assembled under pressure and at elevated temperature. In this process the layers of threads are laminated with synthetic material and copper foil, and the thermosetting synthetic material is cured. On leaving the double belt press 17 the laminate makes a finished substrate or board, from which boards 29 can be sawn with the saw 28. Optionally, a large number of sawn boards can be post-cured together in an oven. Alternatively, there can be continuous post-curing if desired, by providing a post-curing zone downstream of the double belt press and upstream of the sawing station. Using the apparatus according to FIG. 1 it is also possible to manufacture a substrate of five layers of threads by applying an additional 0° layer and 90° layer, respectively, by means of similar extra laying units at the location of the arrows indicated with 30 and 31. FIG. 1 shows the construction in which the threads for the two 0° layers are pulled off of the beams 11 and 14, onto which a plurality of threads has been wound. However, it is by no means essential that beams be employed; like the 90° threads, the threads or yarns for the 0° layers can each be pulled separately off of an individual yarn package arranged in a creel.

In order to avoid serious stagnation of the production process owing to thread breakage, which, though rare, cannot be ruled out altogether, use is made according to the invention of a buffer system. To this end a subframe 10 containing all the laying units for the various layers of threads is employed, which can be moved as indicated by the directions of the arrows 33 and 34 via idlers 32 and an appropriate drive (not shown). During normal operation, i.e., when there is no thread breakage or some other breakdown, a certain buffer length of layers of threads is built up by temporarily moving the subframe 10 against the production direction, as indicated by the arrow 33, say for 10 minutes at a rate of 0.2 m/min for a production rate of, e.g., 2 m/min. In said 10 minutes a 2m buffer length of layers of threads is formed. As soon as there is a thread breakage, the normal rate of production of 2 m/min is reduced to 0.2 m/min and the laying units are stopped. In the 5-10 minute period in which the thread breakage is repaired the aforementioned buffer supply will be used up at least in part, the subframe 10 moving, at the reduced production rate of 0.2 m/min, in the production direction as indicated by the arrow 34. The thread breakage having been repaired, the rate of production is increased again and first of all a new buffer length of layers of threads is built up in order to be prepared for the next thread breakage. The normal rate of production is set again as soon as enough buffer length has been built up.

As was stated earlier, the total amount of reinforcing fibres to be provided in one or more layers in a particular angular direction, say the 0° direction, has to be equal to the total amount amount of reinforcing fibres to be provided in one or more layers in another angular direction, say the 90° direction. For elucidation a further highly simplified view of the production process for a substrate or board of five layers of threads is given in FIG. 2, corresponding parts being indicated with the same reference numerals as in FIG. 1. As is clear from FIG. 2, in this process a laminate is formed from five layers of threads, the threads of each layer extending alternatively in the 0° direction or the 90° direction. Seen crosswise of the moving needle belts 3 and from the bottom towards the top the final laminate will then contain a bottom single 0° layer (1°×0°), a double 90° layer (2°×90°), a central double 0° layer (2°×0°), a double 90° layer (2°×90°), and a top single 0° layer (1°×0° ), with a double layer containing twice as many threads as a single layer. If the mass of a single layer is set at A, then in this example, i.e. 1°×0°+2°×90°+2°×0°+2°×90°+1°×0°, the total mass in the three 0° layers equals A+2A+A=4A and that in the two 90° layers 2A+2A=4A, so that here the set requirement of equal properties in each of the two directions is met.

Figure 2:
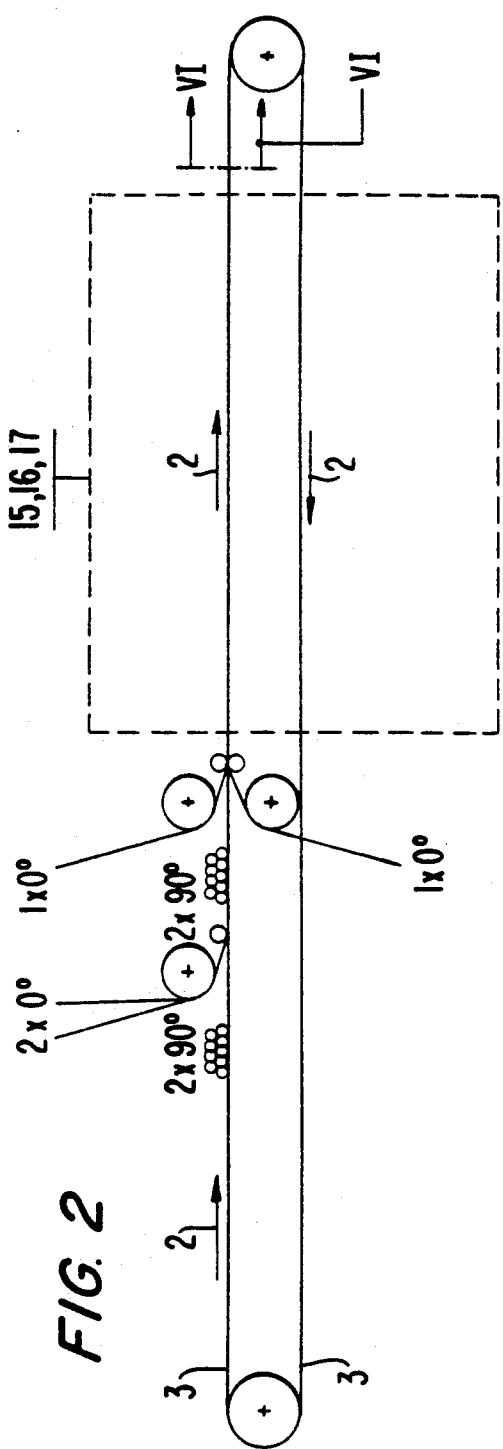
FIG. 2 is a simplified side view of a section of an apparatus of the type according to FIG. 1.

It should be noted that in the description and the claims one layer of threads always refers to either a single or a double layer of which the threads have the same direction. It will be clear that the layers of threads according to the example of FIG. 2 are in mirror image relationship relative to the plane of symmetry. In the example according to FIG. 2, with its uneven number of five layers, the threads in superposed layers are disposed from one side of the substrate to the other successively in alternating angular directions of 0° and 90°, respectively, vis-à-vis the production direction (=0° direction) . Alternatively, in the example according to FIG. 2 the laminate of threads provided with a synthetic material may be coated on both sides with a copper foil (not shown) in the double belt press.

Figure 4:
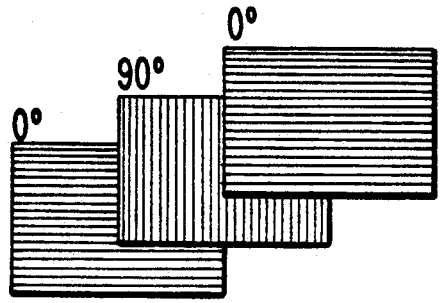
FIG. 4 shows the relative positions of the layers of threads for a 3-layer substrate.

For elucidation FIG. 4 illustrates the relative positions of three layers of threads formed by a bottom single 0° layer (1°×0°), a central double 90° layer (2°×90°), and a top single 0° layer (1°×0°).

Figure 5:
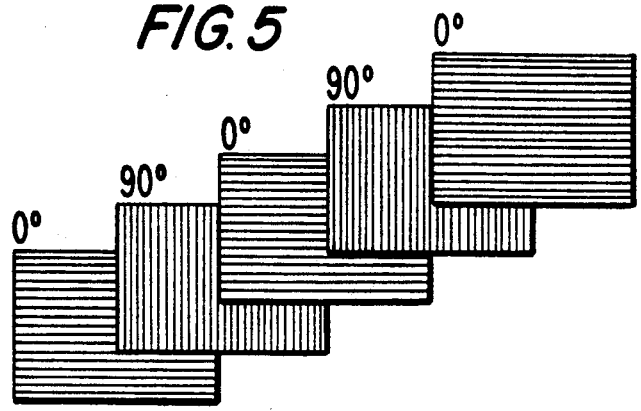
FIG. 5 shows the relative positions of the layers of threads for a 5-layer substrate.

In analogous manner FIG. 5 illustrates the relative positions of five layers of threads formed by a bottom single 0° layer (1°×0°), a double 90° layer (2°×90°), a central double 0° layer (2°×0°), a double 90° layer (2°×90°) , and a top single 0° layer (1°×0°).

Figure 6:
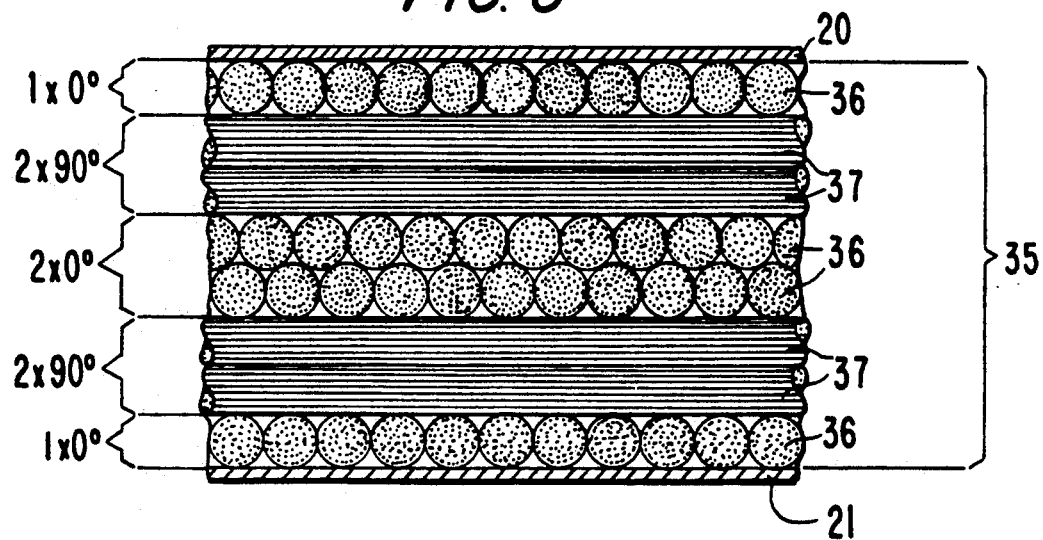
FIG. 6 is a highly magnified view of part of a cross-section of a substrate along the line VI—VI in FIGS. 1 and 2.

For elucidation FIG. 6 shows a highly magnified cross-section along the line VI—VI of a board which has five layers of threads and is coated on both sides with copper foils 20 and 21. The laminate of layers of threads as a whole is indicated with 35. The threads or yarn bundles in the three 0° layers are indicated with 36, the threads or yarn bundles in the two 90° layers with 37.

Figure 7:
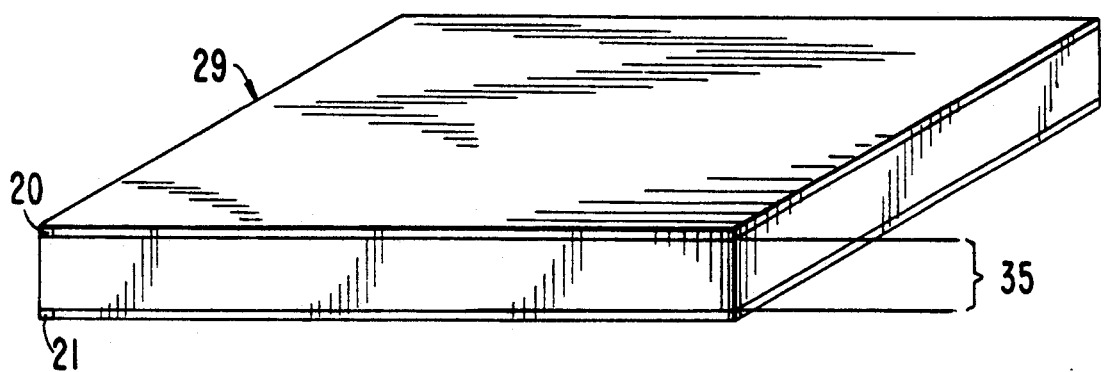
FIG. 7 is a magnified view of a finished substrate coated on either side with a copper foil.

FIG. 7 shows a perspective drawing of a board 29 manufactured according to the process indicated in FIGS. 1 and 2, corresponding components being indicated with the same reference numerals. In actual fact the copper foils 20 and 21 have a thickness of, say, 35 $\mu$m and the laminate of layers of threads 35 impregnated with epoxy resin has a thickness of 1600 $\mu$m, so that the board 29 has an overall thickness of 1670 $\mu$m.

Figure 8:
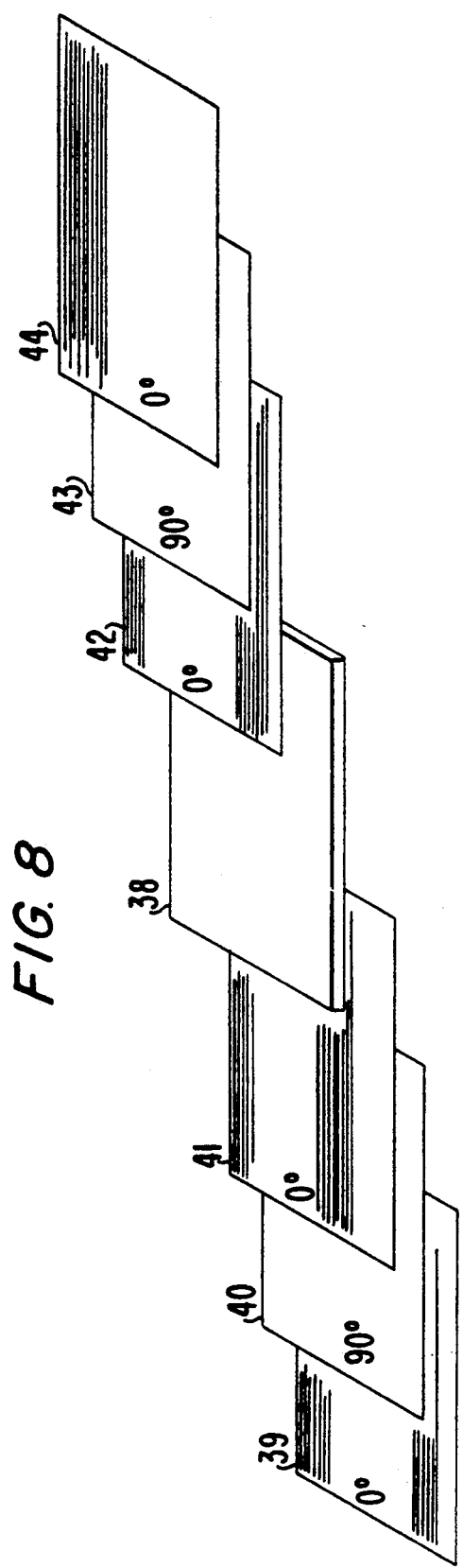
FIG. 8 illustrates the relative positions of the various layers for the manufacture of a multilayer printed wire board.

As has been mentioned hereinbefore, the invention also comprises a process for the manufacture of a multilayer printed wire board. In principle the manufacture of multilayer printed wire boards can also be carried out using apparatus of the type shown in FIGS. 1 and 2, several adjustments having, of course, to be made. The composition of a multilayer printed wire board to be manufactured is illustrated with reference to FIG. 8, in which the relative positions of the various layers for a particular type of multilayer printed wire board are indicated. By and large, manufacturing of the latter type of multilayer printed wire board can be carried out by first making a printed wire board with copper traces on both sides, the width of said board being equal to the integrated laminate manufacturing machine of the type according to FIGS. 1 and 2. First three bottom layers of threads 39, 40, and 41 have to be provided on the machine with the aid of the laying units described hereinbefore. The reinforcing threads in the layers 39, 40, and 41 extend in the 0°, 90°, and 0° directions, respectively. On the top layer of threads 41 the boards 38 with copper traces are placed by a robot arm, the boards having to link up with each other tightly. Next, using the laying units described hereinbefore the top three layers of reinforcing threads 42, 43, and 44 having their threads in the 0°, 90°, and 0° directions, respectively, are provided on top of the boards 38. After the overall package of layers 38, 39, 40, 41, 42, 43, and 44 formed on the machine has been preheated, it is impregnated with a synthetic material, say, epoxy resin and a curing agent. Next, the package of layers is passed through a double belt press, in which the synthetic material is cured at increased pressure and elevated temperature. Finally, the laminate is sawn through in the 90° direction at the location of the original junctions of the boards 38. If a multilayer printed wiring board of the substractive type is to be manufactured, then an additional copper foil has to be fed to the laminate's top and bottom sides just upstream of the double belt press.

It should be noted that in the final phase of manufacturing of printed wire boards two different manufacturing principles can be distinguished. The first, so-called subtractive principle involves providing a foil of copper or some other well-conducting material on one or on either side of a substrate of plastics-impregnated reinforcing fibres. Next, the copper layer is removed by etching, such that the pattern of copper traces desired for the printed wire board is left. In the case of the second, so-called additive principle the desired pattern of copper traces is provided on a substrate of plastics-impregnated reinforcing fibres, optionally after an appropriate surface area treatment but without a copper foil being provided first. Of course, these are only brief indications of the subtractive and additive techniques. Further, use is made of the semi-additive method.

It will be clear from the above that the process according to the invention permits the manufacture of substrates which are suitable for manufacturing printed wire boards either by the subtractive technique or by the additive and semi-additive methods.

Although hereinbefore the reinforcing threads in the layers were always arranged in the 0° direction or the 90° direction, the process according to the invention is not so restricted. In principle it is also possible to provide the threads in superposed layers at various other angles, for instance at +45° or −45° to the production direction. Of course the reinforcing yarns' type and linear density will have to be determined by the skilled man in the appropriate manner. Favourable results are expected when reinforcing yarns of E-glass or D-glass having a yarn linear density of 300 tex are employed. In principle the reinforcing yarns not bonded in the form of a woven fabric that are used in the process according to the invention may be of about the same type as those which are employed in the fabrics when the known processes are used.

The process according to the invention is also suitable for economically manufacturing extremely thin substrates, say 0.1 or 0.3 mm thick, for printed wire boards in a continuous process. Due to the special arrangement of the reinforcing threads and the layers it is possible to manufacture with the process according to the invention a high-quality substrate or board having particularly favourable properties.

Within the scope of the invention various changes may be made. In general the tension exerted on all unbonded threads in all layers of threads should be virtually the same in the different directions. Optionally, the threads or yarns from which the layers of threads are built up may be raised or voluminous, for instance by making use of yarns with projecting fibre tips. It is preferred that such raised or voluminous yarns or threads be used only in the inner layers of threads and not in the outer ones. Using layers of threads composed of raised or voluminous yarns or threads will generate a higher shear strength between the different layers of threads.

By matrix material for the substrate is meant here, a material in which the reinforcing filaments are disposed, forming a matrix. Such matrix material may be made up of different substances, notably of a synthetic material, such as an epoxy resin-based synthetic material or a mixture of synthetic materials, to which, as is customary, various substances, such as fillers, int. al. ceramic particles, whiskers, and the like, plasticizers, flame retardants or catalysts, can be added if desired.

Optionally, the substrate may contain in its core a further electrically and/or thermally conductive or electrically and/or thermally insulating layer, say a laminate of copper, invar, molybdenum or an aluminium layer.

I claim:

1. A continuous process for the manufacture of a printed wire board from a fiber-reinforced matrix, the continuous process comprising a laying stage in which at least two layers of wholly unbonded unwoven threads of reinforcing fibers are superposed and laid on a transport element moving in a plane continuously in a production direction, an impregnation stage in which the layers of threads are passed through an impregnating zone to provide the layers with matrix material and a lamination stage in which the layers of threads are passed through a laminating zone to form a laminate of the layers of threads provided with matrix material, the laminate being provided on one side or on both sides with means for generating electrically conductive tracks, said layers of threads being composed of a plurality of mutually parallel threads of reinforcing fibers which extend substantially rectilinearly, and the layers are superposed such that reinforcing fibers are disposed in at least two crossing directions while remaining wholly unbonded.

2. The process of claim 1, wherein the laminating zone is a double belt press.

3. The process of claim 1, wherein the layers of threads are in the form of a preformed fiber-reinforced matrix material in which the fibers are made up of a plurality of threads which are not bonded in the form of a woven fabric and which extend mutually parallel and substantially rectilinearly.

4. The process of claim 1, wherein each of the thread-containing layers comprising threads not extending in the production direction is laid on a transport element moving continuously in a production direction with the aid of a laying unit.

5. The process of claim 1, wherein the laying stage comprises superposing at least 3 layers of threads.

6. The process of claim 7, wherein the laying stage comprises superposing an odd number of layers of threads in the range of from 3 to 7.

7. The process of claim 7, wherein an overall amount of reinforcing fibers to be provided in one or more of said layers of threads in a particular direction, is substantially equal to the overall amount of reinforcing fibres to be provided in one or more layers of threads in a crossing direction.

8. The process of claim 7, wherein layers of threads are arranged in mirror image relationship relative to a plane of symmetry.

9. The process of claim 7, wherein the substrate is composed of an odd number of said layers of threads, with the threads being provided in superposed layers from one side of the substrate to the other successively in alternating angular directions of 0° and 90° with respect to a production direction.

10. The process of claim 1, wherein the threads in each of said layers of threads are kept under tension at least just prior to being rigidly confined in the matrix.

11. The process of claim 10, wherein the threads are kept under tension by means of needle belts positioned on either side of transport elements and moving with them.

12. The process of claim 1, wherein each thread is composed of a bundle of continuous filaments.

13. The process of claim 12, wherein the bundle of filaments is substantially untwisted.

14. The process of claim 4, wherein all threads which are fed to laying units are fed from thread or yarn packages in a creel.

15. The process of claim 1, wherein in addition to said two or more layers of threads not bonded in the form of a woven fabric and which extend substantially rectilinearly there are provided in mirror image relationship to a plane of symmetry one or more layers composed of a non-woven fabric having threads which do not extend rectilinearly or a woven fabric.

16. The process of claim 1, wherein upstream or downstream of the laminating zone an upper layer is applied to the substrate not coated with a metal foil, which upper layer contains a catalyst promoting the precipitation of an electrically conductive metal and comprises at least one layer of a crosslinked polyamine polymer.

17. The process of claim 16, wherein the polyamine polymer is polyethylene imine.

18. The process of claim 1, wherein the matrix material comprises a synthetic material based on a thermosetting synthetic material.

19. The process of claim 18, wherein the laminating zone is sufficiently heated to cure the matrix material with which the layers of threads have been provided.

20. The process of claim 1, wherein each of the layers of threads is deposited in a plane moving continuously in a production direction and wherein each of the thread-containing layers not extending in the production direction is laid, by means of a laying unit, on a transport element moving continuously in the production direction, wherein a buffer system is employed, the buffer system comprising a sub-frame containing all the laying units for the different layers of threads, which sub-frame during normal operation moves temporarily against the production direction, building up a certain buffer length of layers of threads.

21. A continuous process for the manufacture of multilayer printed wire board, comprising a laying stage in which a board provided on either side with conductive tracks is provided on either side with a layer of wholly unbonded unwoven threads of reinforcing fibers, an impregnation stage in which the layers of threads are passed through an impregnating zone to provide the layers with matrix material and a lamination stage in which the board provided with the layers of threads is passed through a laminating zone, said fibers are laid on a transport element moving in a plane continuously in a production direction, in which process use is made of threads-containing layers composed of a plurality of mutually parallel threads which extend substantially rectilinearly while remaining wholly unbonded.

22. The process of claim 21, wherein a first laminate of layers of threads is formed on a plane moving continuously in a production direction with the use of a moving transport element and laying units, next there is deposited on the first laminate of layers of threads a board provided on both sides with electrically conductive tracks, and subsequently there is provided on the side of the board opposite to the side deposited on the first laminate a second laminate of layers of threads, wherein each laminate of layers of threads comprises at least 3 of said layers of threads and wherein the threads from superposed layers are disposed in crossing directions, after which the board, provided on either side with a matrix material-containing laminate of layers of threads, is passed through the laminating zone.

23. The process of claim 21, wherein the threads in each layer of threads not bonded in the form of a woven fabric are kept under tension at least just prior to being rigidly confined in the matrix.

24. The process of claim 23, wherein the threads are kept under tension by means of needle belts positioned on either side of the transport elements and moving with them.

25. The process of claim 21, wherein in addition to said two or more layers of threads composed of threads not bonded in the form of a woven fabric and which extend substantially rectlinearly there are provided in mirror image relationship relative to a plane of symmetry one or more layers composed of a non-woven fabric having threads which do not extend rectilinearly or a woven fabric.

* * * * *